United States Patent [19]

Smith

[11] Patent Number: 5,331,299
[45] Date of Patent: Jul. 19, 1994

[54] ADAPTIVE TRACKING NOTCH FILTER SYSTEM

[75] Inventor: Norval P. Smith, Lexington, Mass.

[73] Assignee: Massachusetts Institute of Technology, Cambridge, Mass.

[21] Appl. No.: 483,930

[22] Filed: Feb. 23, 1990

[51] Int. Cl.$^5$ .................. H03H 7/01; H03H 17/02
[52] U.S. Cl. .................. 333/175; 333/17.1; 333/176; 307/521
[58] Field of Search ............. 333/17.1, 17.2, 175, 333/176, 167, 170, 171; 342/99, 101; 328/167; 307/521

[56] References Cited

U.S. PATENT DOCUMENTS

| | | | |
|---|---|---|---|
| 3,003,117 | 10/1961 | Stavis | 342/101 X |
| 3,353,147 | 11/1967 | Meeker, Jr. | 328/167 X |
| 3,411,098 | 11/1968 | Perra | 333/176 X |
| 3,562,675 | 2/1971 | Urell | 333/176 X |
| 3,867,712 | 2/1975 | Harthill et al. | 333/17.1 X |
| 3,898,375 | 8/1975 | Hannan et al. | 328/167 X |
| 3,967,102 | 6/1976 | McCown | 333/17.1 X |
| 4,063,450 | 12/1977 | Lyons | 328/167 X |
| 4,195,265 | 3/1980 | Vali | 328/167 |
| 4,395,779 | 7/1983 | Fujino et al. | 333/17.1 X |
| 4,396,916 | 8/1983 | Schnerk | 342/201 X |
| 4,584,580 | 4/1986 | Fujino et al. | 328/167 X |

OTHER PUBLICATIONS

W. B. Bridge et al., Coherent Optical Adaptive Techniques, Feb. 1974, vol. 13, No. 2, Applied Optics, pp. 291-300.

*Primary Examiner*—Gilberto Barrón, Jr.
*Attorney, Agent, or Firm*—Hamilton, Brook, Smith & Reynolds

[57] ABSTRACT

An automatic tracking notch filter system tracks a large-magnitude narrow band signal through frequency effectively eliminating it. A frequency variable notch filter is responsive to a control input at which is applied a small amplitude AC dither signal. The resulting fluctuation in frequency of the notch filter causes corresponding fluctuations in the magnitude of the notch filter output. The output signal is rectified and band pass filtered around the dither frequency before being demodulated with the dither signal to provide a DC error signal indicating the magnitude and direction in frequency of the filter misalignment. The error signal is integrated and input to the control input of the notch filter with the dither signal such that the notch filter tracks the narrow band signal in response to the feedback signal provided at its control input.

34 Claims, 3 Drawing Sheets

ADAPTIVE TRACKING NOTCH FILTER SYSTEM

The Government has rights in this invention pursuant to contract Number F19628-85-C-002 awarded by the Department of the Air Force.

BACKGROUND OF THE INVENTION

In many systems utilizing electronic signals, an unwanted resonant spike or other large-magnitude narrow band signal is present in an otherwise useful signal due to physical properties of the system. One example of such a system is a control system for adjusting the mirror segments of a segmented mirror, such as is used in astronomy or light beam steering applications. These mirror segments often have a resonant frequency which typically introduces a large phase shift in the control system feedback loop which can destabilize the system. Unless the system bandwidth is much lower than the mirror resonant frequency, an appropriate phase margin required for system stability is difficult to achieve.

The traditional method of removing or suppressing such a narrow band signal is through the use of a narrow band stop or notch filter centered around the center frequency of the narrow band signal. However, the center frequency of the narrow band signal may often vary in both frequency and amplitude as a function of temperature, loop band-width, or other system parameters. Such variation imposes a severe restriction on a fixed frequency notch filter. Obtaining sufficient attenuation over the variation in the narrow band center frequency has required the use of a low Q filter or multiple filters. In addition to being less efficient, each of the low Q filter and the multiple filter approaches, when used in a feedback amplifier, can add a significant phase lag at the unity gain crossover frequency of the system. The corresponding reduction in phase margin results in a reduced bandwidth or lower relative stability. More desirable would be a high Q notch filter with automatic frequency tracking to suppress a narrow band signal while tracking it through frequency variations.

SUMMARY OF THE INVENTION

A tracking notch filter system automatically tracks and suppresses a narrow band portion of a signal input to the filter. The notch filter system includes a variable notch filter, the notch center frequency of which moves in response to a signal applied to a control input of the notch filter. To determine the optimum notch center frequency, a dither signal generator also applies an AC dither signal to the control input. This causes the notch center frequency to fluctuate at the frequency of the dither signal. Center frequency adjustment is made as a function of the filter output response to the dither signal.

In a specific embodiment a feedback loop feeds back and modifies an output signal of the notch filter. Within the feedback loop the output signal is converted to a signal having a dither frequency component. A band pass filter passes the component at the dither frequency. That component has amplitude corresponding to the offset of the notch center frequency from the input signal frequency and a phase corresponding to the direction of offset. To extract both amplitude and direction information, the component is input to a synchronous demodulator to be demodulated by a dither drive signal. The demodulated signal is then integrated with an integrator and used to modify the dither drive signal applied to the notch filter control input.

Further included with the suppression filter may be a feed-forward circuit which generates a DC scaling signal proportional to the magnitude of the input. The scaling signal is used in the feedback loop to control the magnitude of the feedback signal prior to its being applied at the notch filter control input.

DETAILED DESCRIPTION OF A PREFERRED EMBODIMENT

Figure 1:
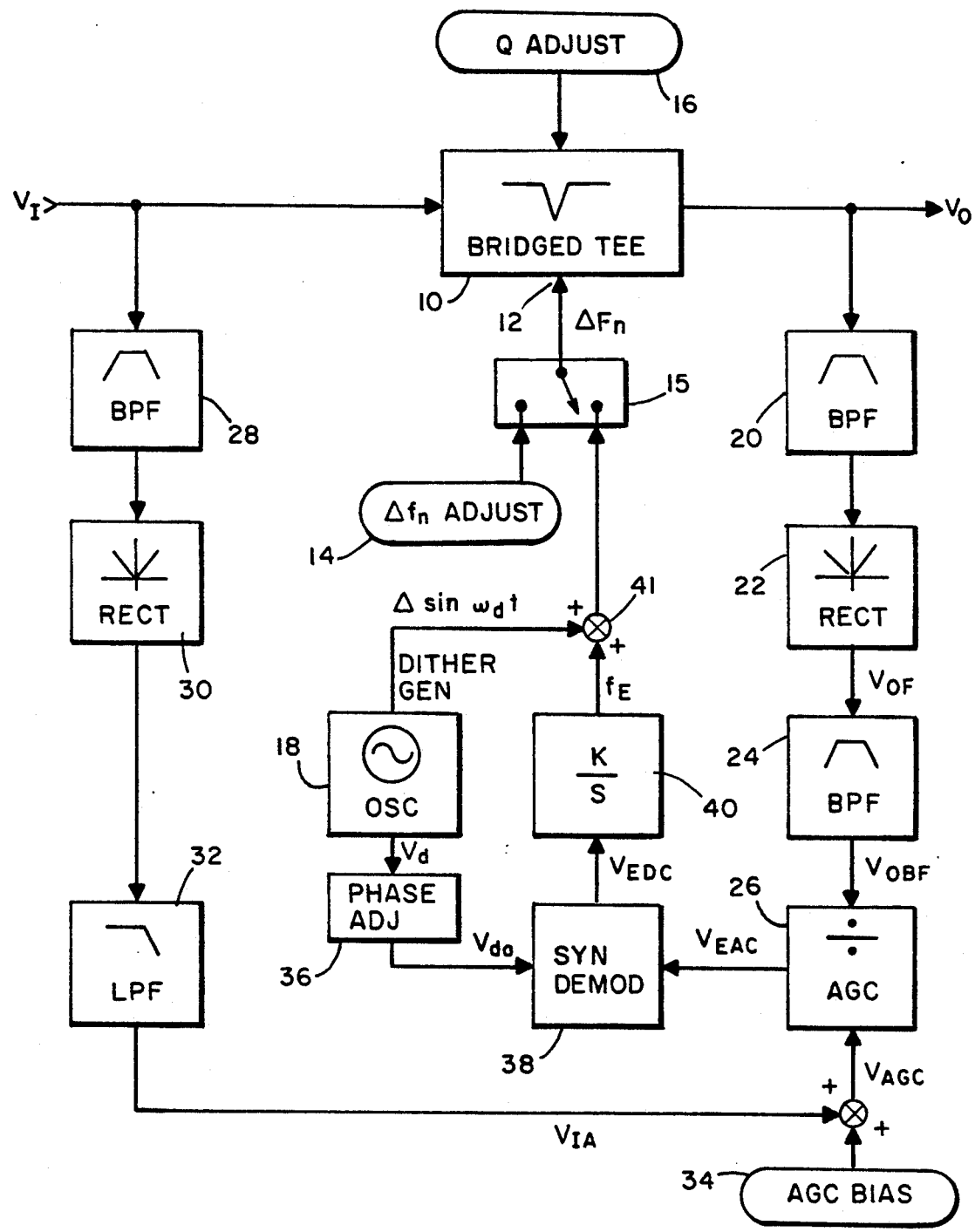
FIG. 1 is a system block diagram of a tracking notch filter system.

FIG. 1 shows a system block diagram of a preferred embodiment of a tracking notch filter system. Bridged-T notch filter 10 has an input $V_I$ and an output $V_O$. The notch filter 10 is variable in frequency such that its center frequency may be shifted up or down in frequency in response to a control input 12. Prior to application of input signal $V_I$, the notch filter 10 is manually adjusted using filter adjustor 14. To perform this adjustment, filter input switch 15 is switched to provide electrical contact between the filter control input 12 and filter adjustor 14. Filter adjustor 14 is then used to adjust the notch filter so that the notch center frequency $f_n$ is located at the expected center frequency of a narrow band portion of $V_I$ that is to be suppressed. At this time, the quality factor (Q) of the filter is also manually adjusted using Q adjustor 16 such that the notch filter frequency response best fits the response of the narrow band signal portion. Once the adjustments are complete, filter input switch 15 is switched to enable the feedback control of the notch filter system by providing electrical contact between filter input 12 and summing node 41.

A positive control voltage applied through control input 12 causes the notch center frequency to increase while a negative voltage causes the notch center frequency to decrease. A dither signal from a dither generator 18 is applied to the control input 12 in combination with an error signal $f_E$. The dither signal is an AC signal and in the present embodiment is a sinusoid. The application of the AC signal to the control input 12 causes the center frequency of the notch filter 10 to fluctuate at the frequency $\omega_d$ of the dither signal. The amplitude of the dither signal is typically small relative to the amplitude and bandwidth of the input signal $V_I$.

Figure 2:
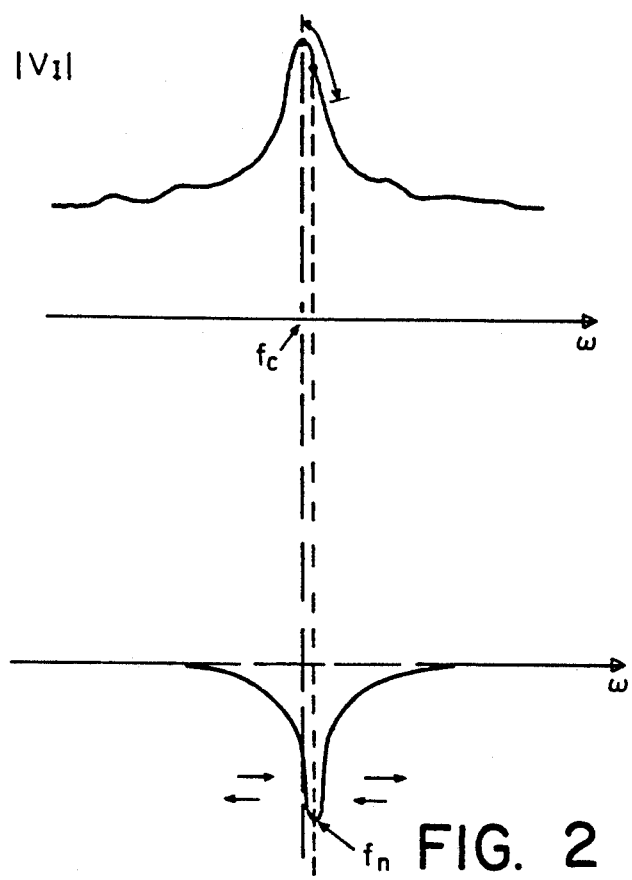
FIG. 2 is a frequency plot showing the frequency characteristic of an input signal having a narrow band portion and the response of a notch filter having a center frequency slightly higher in frequency than the center frequency of the narrow band portion.

FIG. 2 shows the frequency response of an input signal $V_I$ having a narrow band signal component centered at frequency $f_c$. The frequency response of a notch filter system for suppressing the narrow band portion of $V_I$ is also shown in FIG. 2 relative to the frequency scale of $V_I$. The notch filter has a notch center frequency $f_n$. The goal of the notch filter system is to keep the notch center frequency $f_n$ as close as possible to the narrow band center frequency $f_c$ of $V_I$. In FIG. 2 $f_n$ is slightly higher in frequency than narrow band center frequency $f_c$. Thus an error in the alignment of the notch center frequency exists which must be corrected.

Figure 3A:
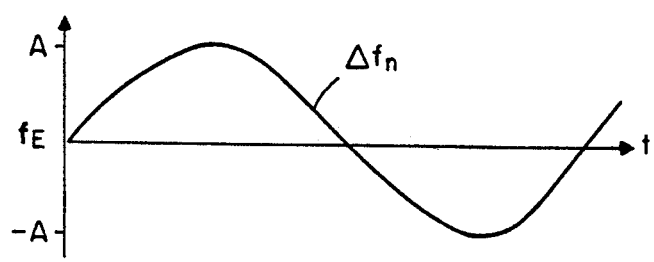
FIGS. 3A-3F show the changes in a test signal as it is passed through the feedback loop of the notch filter system.
Figure 3B:
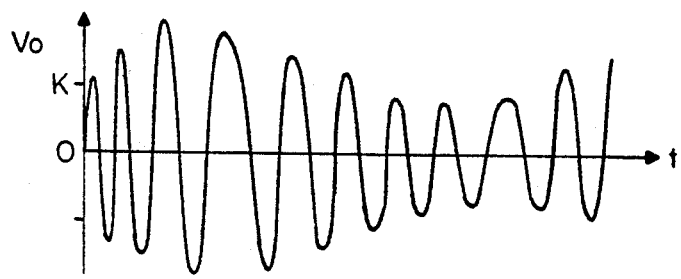
Figure 3C:
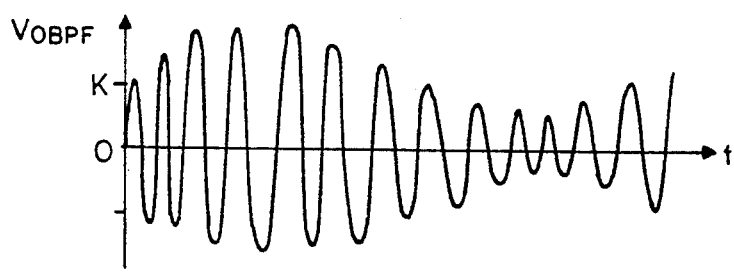

As demonstrated by the arrows adjacent the notch filter frequency response of FIG. 2, the center of the notch filter is varying in frequency with the control input signal $\Delta f_n$. $\Delta f_n = f_E + A\sin(\omega_d t)$ and causes a sinusoidal fluctuation of the notch center frequency $f_n$ at the dither frequency $\omega_d$. FIG. 3A shows the control input signal $\Delta f_n$. FIG. 3B illustrates the output of the notch filter with a high frequency input and dither of the notch frequency with the control signal $\Delta f_n$. The fluctuation of the notch filter frequency response causes a fluctuation in the magnitude of $V_O$. The signal of FIG. 3B corresponds to a situation in which the notch filter is offset higher in frequency than the narrowband signal portion, such as in FIG. 2. Since the notch filter center frequency increases with positive increases in voltage at the $\Delta f_n$ input the sinusoidal fluctuation in the envelope of the output signal $V_O$ shown in FIG. 3B is in phase with the dither signal.

To demonstrate the system performance of the present embodiment a sinusoid at frequency $\omega_c$ is input as signal $V_I$ where $\omega_c = 2\pi f_c$. It is assumed that $\omega_c > > \omega_d$. As the signal passes through the notch filter system, it is attenuated by the notch filter 10 which is fluctuating in frequency around $f_n$. With the notch filter center frequency $f_n$ offset slightly higher in frequency than $f_c$, as in FIG. 2, the shifting of the notch filter upwards in frequency causes the attenuation of a signal at $f_c$ to decrease. This corresponds to a magnitude increase in the $\omega_c$ frequency component of $V_O$. Similarly, the shifting downward in frequency of the notch filter causes the attenuation at $f_c$ to increase, and the magnitude of $V_O$ to correspondingly decrease. Therefore, when the filter is offset as in FIG. 2, the application of the dither signal to the notch filter causes a dither frequency sinusoidal fluctuation in the envelope of $V_O$ which is in phase with the dither signal. This is demonstrated in the sketch of $V_O$ shown in FIG. 3B. As shown, the result is that $V_O$ appears as the amplitude modulated signal $(\sin\omega_c t)(\sin\omega_d t)$, the modulating frequency being the dither frequency $\omega_d$.

The notch filter output signal $V_O$ is input to the band pass filter 20 of the feedback loop, as shown in FIG. 1. Band pass filter 20 passes only frequencies in the range of the narrow band signal portion of $V_I$, removing high frequency and low frequency signal components which are outside the frequency range of interest. For the pure $\omega_c$ input signal of the present example, signal $V_{OBPF}$ is identical to $V_O$, since $V_O$ has no very high or very low frequency components to be removed by filter 20. $V_{OBPF}$, like $V_O$, therefore consists of a $\sin\omega_c t$ carrier modulated by a $\sin\omega_d t$ envelope. However, if $V_O$ were to contain any frequency components outside the range of filter 20, these components would not be present in $V_{OBPF}$. This filtering increases the signal-to-noise ratio of the feedback signal by removing the signal power outside of the frequency range of interest.

Figure 3D:
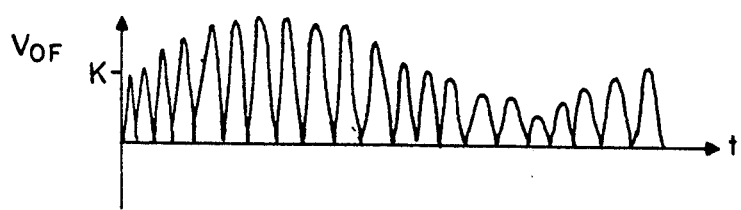

After filtering, the signal $V_{OBPF}$ is input to full wave rectifier 22. Rectifier 22 is a non-linear element of the feedback loop which forces the signal $V_{OBPF}$ to be all positive. The resulting signal $V_{OF}$ is shown in FIG. 3D. As demonstrated by $V_{OF}$, all the negative signal portions of $V_{OBPF}$ become inverted by the rectifier. However, the signal $V_{OF}$ is still modulated by the $\omega_d$ frequency component. The rectification of signal $V_{OBPF}$ adds some harmonics to the signal, as well as adding a DC component.

Figure 3E:
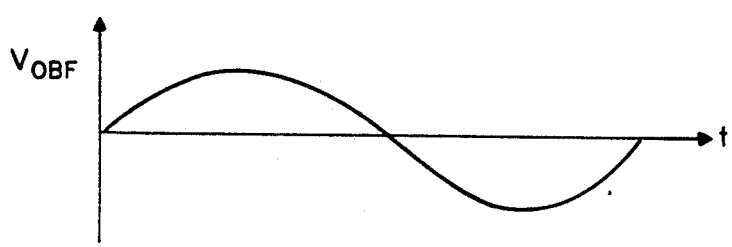

Once rectified, signal $V_{OF}$ is input to band pass filter 24. Band pass filter 24 is a narrow response filter centered around the dither frequency $\omega_d$. The output of filter 24 is signal $V_{OBF}$ which is the dither frequency component of $V_{OF}$. Signal $V_{OBF}$ is shown in FIG. 3E. Contained in $V_{OBF}$ is information sufficient to determine the frequency error of the notch filter center frequency so that a correcting error signal may be generated. However, prior to demodulating signal $V_{OBF}$, the signal is normalized to the input signal to conform the magnitude of the error signal to any changes in the magnitude of input signal $V_I$.

Referring to FIG. 1, the signal $V_{OBF}$ is input to AGC divider 26. The AGC divider 26 isolates the feedback signal from amplitude variations in input signal $V_I$ by normalizing $V_{OBF}$ to the input signal. This is accomplished by dividing $V_{OBF}$ by DC scalar signal $V_{AGC}$ which has a magnitude proportional to the magnitude of $V_I$. To obtain the AGC divider signal, input signal $V_I$ is fed into a band pass filter 28 similar to the band pass filter 20 of the feedback circuit. The band pass filter 28 is the first stage in an automatic gain control feed-forward circuit, and filters out a band of frequencies encompassing the range of the narrow band signal. The output of band pass filter 28 is then fed into rectifier 30 which separates the filtered signal into a series of harmonic components including a DC RMS signal. The output of the rectifier 30 is then passed through low pass filter 32 to remove any high frequency components leaving just the DC component. To manually adjust the scaling of the feedback signal by the AGC feed-forward circuit, an AGC bias voltage from AGC bias input 34 may be added to the output of low pass filter 32 ($V_{IA}$). $V_{AGC}$ is then used to scale $V_{OBF}$ in divider 26 by dividing $V_{OBF}$ by $V_{AGC}$. Thus the feedback signal is normalized to the system input and divider output $V_{EAC}$ is generated.

Figure 3F:
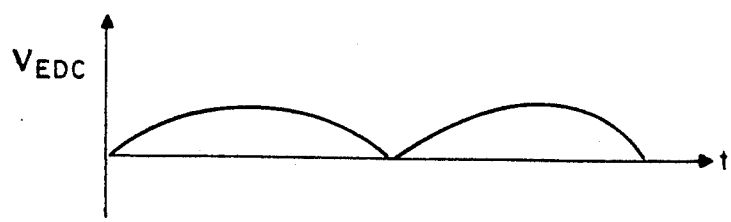

After being normalized, the divider output signal $V_{EAC}$ is input to synchronous demodulator 38. During calibration 18 of the notch filter system, one output of the dither signal generator 18 is input to phase adjustor 36 where the phase of $V_d$ is manually adjusted. The phase adjustment compensates for any phase shift in the feedback signal introduced by feedback components 20, 22, 24, 26. This assures that relative phase shift between the feedback signal and the phase-adjusted dither signal is due to the positioning of the notch filter 10 in frequency, and not to inherent reactances of the feedback components. The output of the phase adjustor $V_{da}$ and the divider 26 are fed into synchronous demodulator 38. The demodulator 38 is a multiplier which outputs a DC component $V_{EDC}$ having a magnitude proportional to the magnitude of $V_{EAC}$ and a polarity corresponding to the relative phase relationship between $V_{da}$ and $V_{EAC}$. If the notch filter center frequency is higher in frequency than the narrow band center frequency, as in FIG. 2, $V_{EAC}$ is in phase with $V_d$ and the multiplication of $V_{EAC}$ with $V_d$ causes $V_{EDC}$ to have a positive DC component. FIG. 3F shows $V_{EDC}$ for the previous example of the single frequency ($\omega_c$) input signal.

The output of demodulator, $V_{EDC}$, is input to integrator 40. The integrator circuit averages the $V_{EDC}$ input signal over time. This provides a DC signal, $f_E$, which goes to zero when the DC component of $V_{EDC}$ becomes zero. The integrator 40 also inverts $V_{EDC}$ so that $f_E$ has a polarity opposite to that of the DC component of $V_{EDC}$.

The error signal $f_E$ is combined with the dither signal at summing node 41. From summing node 41, the combined signals are applied to the notch filter input 12 through filter input switch 15. Prior to applying the feedback signal, the notch filter center frequency $f_n$ is slightly higher than the narrow band signal portion center frequency $f_c$, as shown in FIG. 2. Therefore, $V_{da}$ and $V_{EDC}$ are in phase, and $V_{EDC}$ is positive. Since this makes $f_E$ negative, the application of the signal at the dither input of notch filter 10 causes the center frequency $f_n$ of the notch filter to decrease in frequency. Thus, the filter center frequency gets closer to frequency $f_c$ to more efficiently attenuate the narrow band signal portion. The more efficient attenuation correspondingly reduces the error signal by reducing the magnitude of the dither frequency component of $V_O$. This feedback control of the notch center frequency $f_n$ continues to shift $f_n$ in frequency until $f_n = f_c$. Thus, the notch filter "tracks" the narrow band signal portion.

Figure 4:
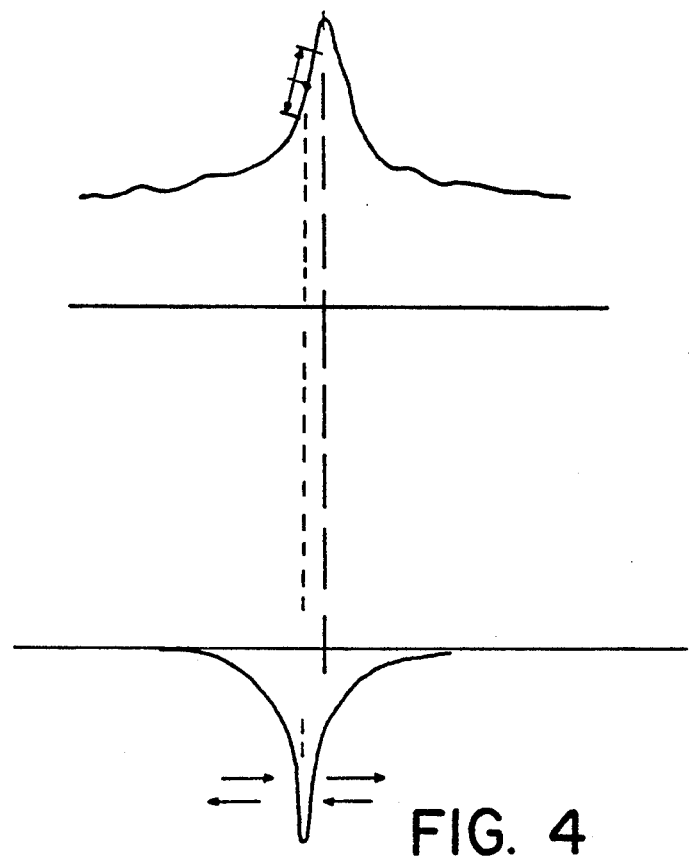
FIG. 4 shows the frequency characteristic of an input signal having a narrow band portion and the response of a notch filter having a center frequency slightly lower in frequency than the center frequency of the narrow band signal portion.

In contrast to FIG. 2, the possibility of the notch filter being offset lower in frequency than the narrow band signal portion of $V_I$ is demonstrated in FIG. 4. The sinusoidal dither signal input to the filter in FIG. 4 still causes the notch filter center frequency to fluctuate in frequency sinusoidally, as in FIG. 2. However, when the filter notch moves upward in frequency in response to the positive half cycle of the dither signal, the attenuation of the narrow band signal increases, causing a corresponding decrease in the magnitude of $V_O$. Similarly, the negative half cycle of the dither signal causes an increase in the magnitude of $V_O$. Therefore, when the filter is positioned lower in frequency than the narrow band signal, the dither frequency component $\omega_d$ of $V_O$ is 180° out of phase with the dither signal. The dither frequency component is extracted and demodulated, just as with the feedback signal for the filter positioning of FIG. 2. However since this $\omega_d$ component is 180° out of phase with the dither signal, the demodulation of this signal with the adjusted dither signal $V_{da}$ generates a demodulator output $V_{EDC}$ which has a negative DC component.

When a negative DC signal component is input to integrator 40, the inverting nature of the integrator causes the circuit to generate an output, $f_E$, with a positive DC component. This positive $f_E$ is then combined with the dither signal and input to the notch filter 10 through switch 15. The positive DC error signal causes the position of the notch filter center frequency to increase in frequency. Since the original position as shown in FIG. 4 was lower than the narrow band signal center frequency, this moves the filter into better alignment with the narrow band signal. The filter notch therefore continues to move upward in frequency until $f_n = f_c$ and the DC error signal is minimized. Thus the narrow band signal portion is "tracked" and the efficiency of the filter is maximized.

By comparing the example of FIG. 2 and that of FIG. 4, it will be apparent that whichever way the center frequency of the tracking notch filter may drift relative to the portion of the input signal to be suppressed, the filter system shifts the notch center frequency to compensate for the drift. Thus, the notch filter system tracks the signal portion to provide the most effective attenuation.

While the invention has been particularly shown and described with reference to a preferred embodiment thereof, it will be understood by those skilled in the art that various changes in form and details may be made therein without departing from the spirit and scope of the invention as defined by the appended claims. In particular, the above method of dithering a variable notch filter to get usable output fluctuations can be applied to types of filters other than notch filters. Band pass filters could easily use the method of the present invention. In addition, low pass or high pass filters, having a center frequency at the filter 3 dB point, could also be adapted to use dithering for tracking an input signal. By matching the characteristic of a variable filter to the signal portion being tracked, a system can be arranged which forces the filter to seek a frequency band which allows the lowest (or highest) output fluctuation. If more than one signal portion needs to be tracked and filtered, more than one filter may be used in series, each tracking a different signal portion.

Implementation of the tracking notch filter concept shown in FIG. 1 can be accomplished either with analog circuit components or with digital techniques such as digital signal processors, computers or discrete logic components.

I claim:

1. A tracking attenuation filter system comprising:
   an attenuation filter for filtering an input signal to produce an output signal;
   an alternating dither signal applied to the filter to dither a center frequency of the filter; and
   a feedback circuit coupled to receive the filter output signal, the feedback circuit responding to a component of the output signal resulting from the dither of the center frequency to generate a feedback signal which is applied to the filter in combination with the dither signal to vary the center frequency of the filter for increase suppression of select frequencies of the input signal.

2. A tracking attenuation filter system according to claim 1 wherein the attenuation filter is a notch filter.

3. A tracking attenuation filter system according to claim 2 wherein the attenuation filter is a bridged-T type filter.

4. A tracking attenuation filter system according to claim 1 wherein said component of the filter output signal resulting from the dither of the center frequency is a component at the frequency of the dither signal.

5. A tracking attenuation filter system according to claim 4 wherein the feedback circuit extracts said component of the filter output signal which is at the frequency of the dither signal to generate a feedback signal.

6. A tracking attenuation filter system according to claim 5 wherein the feedback signal is scaled to the magnitude of the filter input signal.

7. A tracking attenuation filter system according to claim 6 further comprising a feed-forward circuit which receives the filter input signal, the feed-forward circuit generating a scaling signal used for said scaling of the feedback signal.

8. A tracking attenuation filter system according to claim 7 wherein the feedback signal is divided by the scaling signal.

9. A tracking attenuation filter system according to claim 5 wherein the feedback signal is synchronously demodulated with the dither signal to generate a DC error signal.

10. A tracking attenuation filter according to claim 9 further comprising a phase adjustor for adjusting the relative phase of the feedback signal and the dither signal prior to demodulation.

11. A tracking attenuation filter system according to claim 9 wherein the DC error signal is applied to the filter in combination with the dither signal.

12. A tracking attenuation filter system according to claim 9 wherein the DC error signal is input to an integrator circuit the output of which is applied to the attenuation filter in combination with the dither signal.

13. A tracking attenuation filter system according to claim 12 wherein the attenuation filter is a notch filter.

14. A tracking attenuation filter system according to claim 1 further comprising a Q adjustor for adjusting the quality factor of the notch filter.

15. A tracking attenuation filter system according to claim 1 wherein the feedback circuit comprises:
 a first band pass filter receiving the filter output signal and passing a frequency band of interest;
 a rectifier receiving and rectifying a signal from the first band pass filter;
 a second band pass filter receiving a signal from the rectifier and passing a dither frequency component of the received signal; and
 a synchronous demodulator receiving a signal from the rectifier and demodulating the received signal with the dither signal.

16. A tracking attenuation filter system according to claim 15 further comprising an integrator circuit receiving a signal from the synchronous demodulator and integrating the received signal.

17. A tracking attenuation filter system according to claim 16 wherein the attenuation filter is a notch filter.

18. A tracking attenuation filter system according to claim 15 further comprising a phase adjustor for adjusting the relative phase between said signal received from the second band pass filter and the dither signal.

19. A tracking attenuation filter system according to claim 1 further comprising manual filter adjustor for manually adjusting the center frequency of the filter.

20. A tracking notch filter system comprising:
 a notch filter for filtering an input signal to produce an output signal;
 a dither signal applied to the notch filter to dither a notch center frequency of the filter; and
 a feedback circuit comprising:
 a first band pass filter coupled to receive the output signal of the notch filter and pass a select frequency band of the output signal;
 a rectifier receiving and rectifying a signal from the first band pass filter;
 a second band pass filter receiving a signal from the rectifier and passing a dither frequency component of the received signal;
 a synchronous demodulator receiving a signal from the second band pass filter and synchronously demodulating the received signal with the dither signal; and
 an integrator circuit receiving and integrating a signal from the synchronous demodulator, an output of the integrator circuit being applied to the notch filter in combination with the dither signal.

21. A tracking notch filter system according to claim 20 further comprising a phase adjustor for adjusting the relative phase of said signal received from the second band pass filter and the dither signal.

22. A tracking notch filter system according to claim 20, further comprising a feed-forward circuit generating a scaling signal proportional in magnitude to the notch filter input, said scaling signal being applied to the feedback circuit to scale the magnitude of a signal in the feedback circuit.

23. A tracking notch filter system according to claim 22 wherein said feed-forward circuit is an automatic gain control circuit.

24. A tracking notch filter system according to claim 22 wherein the feed-forward circuit comprises:
 an input band pass filter coupled to receive the notch filter input signal and pass a select frequency band;
 an input rectifier receiving and rectifying a signal from the input band pass filter; and
 a low pass filter receiving a signal from the input rectifier and passing a DC component of the received signal as said scaling signal.

25. A tracking notch filter system according to claim 22 further comprising a manual scaling adjustor for manually adjusting the magnitude of the scaling signal.

26. A tracking notch filter system according to claim 20 further comprising a manual filter adjustor for manually adjusting the center frequency of the notch filter.

27. A tracking notch filter system according to claim 20 further comprising a Q adjustor for adjusting the quality factor of the notch filter.

28. A tracking notch filter system for tracking and suppressing a large-magnitude, narrow band portion of a notch filter input signal comprising:
 a bridged-T notch filter for filtering the input signal to produce an output signal;
 a dither signal generator applying a dither signal to the notch filter such that the notch center frequency fluctuates at the frequency of the dither signal;
 a feed-forward circuit generating a DC scaling signal having a magnitude proportional to the magnitude of said narrow band input signal portion; and
 a feedback circuit coupled to receive the filter output signal, the feedback circuit comprising:
 a first band pass filter passing the frequency band of the narrow band, large-magnitude input signal portion;
 a rectifier receiving and rectifying a signal input from the first band pass filter;
 a second band pass filter passing a dither frequency component of a signal received from the rectifier;
 a scaler dividing the output of the second band pass filter by said scaling signal;
 a synchronous demodulator multiplying the output of the scaler by the dither signal; and
 an integrator circuit integrating the output of the synchronous demodulator, the output of the integrator being applied to the control input of the notch filter in combination with the dither signal.

29. A tracking filter system according to claim 28 further comprising a manual phase adjustor for adjusting the relative phase of the output of the second band pass filter and the dither signal.

30. A tracking notch filter system according to claim 28 further comprising a manual scaling adjustor to manually adjust the magnitude of said scaling signal.

31. Method of tracking and attenuating select frequencies of an input signal, comprising:
 providing an attenuation filter for filtering the input signal to produce an output signal;
 applying an alternating dither signal to the filter to dither a center frequency of the filter;

feeding back a signal from the output of the attenuation filter, the feedback signal containing a component of the output signal resulting from the dither of the attenuation filter center frequency; and applying the feedback signal to the attenuation filter in combination with the dither signal to vary the center frequency of the filter for increased attenuation of said select frequencies.

32. The method of claim 31 further comprising scaling the feedback signal by a factor proportional to the magnitude of the narrow band portion of the input signal.

33. A method of tracking and attenuating a narrow band, large-magnitude portion of an input signal, the method comprising:

provicing a notch filter for filtering the input signal to produce an output signal;

applying a dither signal to the notch filter to dither a center frequency of the notch filter;

filtering with a first band pass filter an output of the notch filter to pass a frequency band containing frequencies of said narrow band;

rectifying an output of the first band pass filter;

filtering with a second band pass filter an output of the rectifier to pass a band of frequencies containing the dither frequency;

synchronously demodulating an output of the second band pass filter signal with the dither signal;

integrating the synchronously demodulated signal with an integrator circuit; and applying the output of the integrator circuit to the notch filter tn combination with the dither signal to vary the notch center frequency of the notch filter to better attenuate the narrow band input signal portion.

34. The method of claim 33, further comprising scaling the DC magnitude of the signal applied to the notch filter to be proportional to the magnitude of said narrow band portion of the input signal.

* * * * *